United States Patent
Finley et al.

(10) Patent No.: US 6,346,174 B1
(45) Date of Patent: *Feb. 12, 2002

(54) DURABLE SPUTTERED METAL OXIDE COATING

(75) Inventors: James J. Finley; Mehran Arbab, both of Pittsburgh, PA (US)

(73) Assignee: PPG Industries Ohio, Inc., Cleveland, OH (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/508,408

(22) Filed: Jul. 28, 1995

Related U.S. Application Data

(62) Division of application No. 08/151,229, filed on Nov. 12, 1993, now abandoned.

(51) Int. Cl.⁷ .............................................. C23C 14/34
(52) U.S. Cl. .............................. 204/192.15; 204/192.26
(58) Field of Search ........................ 204/192.15, 192.16, 204/192.22, 192.26

(56) References Cited

U.S. PATENT DOCUMENTS

| | | | |
|---|---|---|---|
| 3,655,545 A | 4/1972 | Gillery et al. | 204/192.29 |
| 3,962,488 A | 6/1976 | Gillery | 427/109 |
| 4,194,022 A | 3/1980 | Gillery | 427/109 |
| 4,216,259 A | 8/1980 | Groth | 428/216 |
| 4,522,844 A * | 6/1985 | Khanna et al. | 204/192.11 |
| 4,696,731 A * | 9/1987 | Tenhover | 204/192.15 X |
| 4,716,086 A | 12/1987 | Gillery et al. | 428/630 |
| 4,717,632 A | 1/1988 | Keem et al. | 428/698 |
| 4,786,563 A | 11/1988 | Gillery et al. | 428/630 |
| 4,806,220 A | 2/1989 | Finley | 204/192.27 |
| 4,898,789 A | 2/1990 | Finley | 428/623 |
| 4,898,790 A | 2/1990 | Finley | 428/623 |

(List continued on next page.)

FOREIGN PATENT DOCUMENTS

| | | |
|---|---|---|
| EP | 0 354 391 | 2/1990 |
| GB | 2178064 | 2/1987 |

OTHER PUBLICATIONS

Inoue et al., *Materials Letters* 16 (1993) pp. 181–184, "Nitrogen–induced amorphization in $Al_{80}Ti_{20}$ films prepared by reactive sputtering".

Geraghty, K. G. et al., "Kinetics of the Reactive Sputter Deposition of Titanium Oxides", Journal Of The Electrochemical Society, Aug. 1976, vol. 123, Nr. 8, pp. 1201–1207.

Yoshitake, M. et al., "The Use of Ion Beam Current as a Process Control in the Reactive Sputtering of Zirconium Oxide", Thin Solid Films, Jul. 15, 1993, vol. 230, Nr. 1, pp. 48–54.

Sato et al., *Thin Solid Films* 86 (1981) pp. 21–30, "Thermal Oxidation of β–Ta Below 500°C".

*Primary Examiner*—Nam Nguyen
*Assistant Examiner*—Gregg Cantelmo
(74) *Attorney, Agent, or Firm*—Donald C. Lepiane

(57) ABSTRACT

A method and resultant product are disclosed wherein a metal film is deposited by sputtering a metal cathode target in an essentially nonreactive atmosphere comprising inert gas and a reactive gas, wherein the concentration of reactive gas is sufficiently low that the sputtering is accomplished in the metallic mode, i.e. the film is deposited as metal. The metal film of the present invention is harder than a metal film sputtered in an atmosphere consisting of only inert gas. The method and resultant product may further comprise thermal oxidation of the metal film, which proceeds more efficiently than oxidation of a metal film sputtered in an atmosphere consisting of only inert gas.

45 Claims, 3 Drawing Sheets

U.S. PATENT DOCUMENTS

| | | | |
|---|---|---|---|
| 5,028,759 A | 7/1991 | Finley | 219/203 |
| 5,059,295 A | 10/1991 | Finley | 204/192.27 |
| 5,062,937 A | 11/1991 | Komuro | 204/192.15 |
| 5,073,451 A | 12/1991 | Iida et al. | 428/336 |
| 5,078,846 A * | 1/1992 | Miller et al. | 204/192.15 X |
| 5,087,340 A | 2/1992 | Onagi et al. | 204/192.2 |
| 5,108,846 A * | 4/1992 | Steininger | 204/192.15 X |
| 5,110,637 A | 5/1992 | Ando et al. | 428/34 |
| 5,110,662 A * | 5/1992 | Depaun et al. | 204/192.26 X |
| 5,128,214 A | 7/1992 | Takayanagi et al. | 428/681 |
| 5,209,835 A | 5/1993 | Makino et al. | 204/192.16 |
| 5,270,517 A | 12/1993 | Finley | 219/203 |
| 5,292,417 A | 3/1994 | Kugler | 204/192.13 |
| 5,302,449 A | 4/1994 | Eby et al. | 428/336 |
| 5,302,461 A | 4/1994 | Anthony | 428/472 |
| 5,318,685 A | 6/1994 | O'Shaughnessy | 204/192.27 |
| 5,332,618 A | 7/1994 | Austin | 428/216 |

* cited by examiner

FIG. I

DURABLE SPUTTERED METAL OXIDE COATING

This is a divisional of application Ser. No. 08/151,229, filed Nov. 12, 1993, now abandoned.

BACKGROUND

1. Field of the Invention

The present invention relates generally to the art of sputtered films and more particularly to the art of durable metal oxide films produced by magnetron sputtering.

2. Discussion of the Present Technology

Sputtered metal oxide films are well known in the art. Tin oxide, zinc oxide, titanium oxide and many other metal oxides are known to be deposited by sputtering the respective metals in an oxidizing atmosphere such as air or a mixture of oxygen and inert gas such as argon. It is also known that a metal film can be deposited by sputtering a metal in an inert atmosphere such as argon, and the metal film subsequently oxidized thermally by heating in an oxidizing atmosphere such as air.

Various metals can be deposited either as metallic films or metal oxide films depending on whether the metal cathode target is sputtered in an inert atmosphere or an oxidizing atmosphere. Generally, sputtering in an inert atmosphere, i.e. in the metallic mode, is faster and more efficient. The resulting coating is a metal film having metallic properties, i.e. generally low transmittance, high reflectance and electrically conductive. Such films are generally not very hard or durable, and are easily damaged in handling. Dielectric metal oxide films are typically high transmittance, lower reflectance and electrically insulating. However, because they are insulating, they do not deposit as efficiently by sputtering. To produce very thick metal oxide films by sputtering is inefficient, costly and may not result in a durable film. To produce very thick metal oxide films by thermally oxidizing metal films efficiently sputtered in an inert atmosphere is inherently rate-limited because oxygen may not readily penetrate beyond the initially formed surface layer of metal oxide.

SUMMARY OF THE INVENTION

The present invention involves a method of sputtering a metal target in an atmosphere sufficiently inert that sputtering is performed in the metallic mode and the film deposited is in an essentially metallic state. However, sufficient reactive gas is added to the atmosphere so that the metal film is amorphous rather than crystalline. The amorphous sputtered metal film is harder and more durable than a metal film sputtered in an atmosphere consisting of only inert gas. The amorphous sputtered metal film may be thermally oxidized more efficiently than a metal film deposited in an atmosphere consisting of only inert gas, resulting in a crystalline metal oxide film which is substantially more chemically durable than an amorphous metal oxide film deposited by sputtering metal in an oxidizing atmosphere.

DESCRIPTION OF PREFERRED EMBODIMENT

Metals such as titanium, zirconium, tantalum, hafnium, niobium, vanadium and mixtures thereof, preferably titanium and zirconium, may be deposited in a substantially amorphous metallic state in accordance with the present invention by sputtering the metal in a nonreactive atmosphere substantially comprising inert gas, but also comprising a small amount of reactive gas, such as oxygen and/or nitrogen, preferably oxygen. The amount of oxygen is sufficient to effect the deposition of the metal in a substantially amorphous rather than crystalline state, but insufficient to effect the transition of sputtering from the metallic mode to the oxide mode. The appropriate amount of oxygen in the inert gas for purposes of the present invention is related to the cathode operating parameters, particularly the power, and the size of the target.

Figure 1:
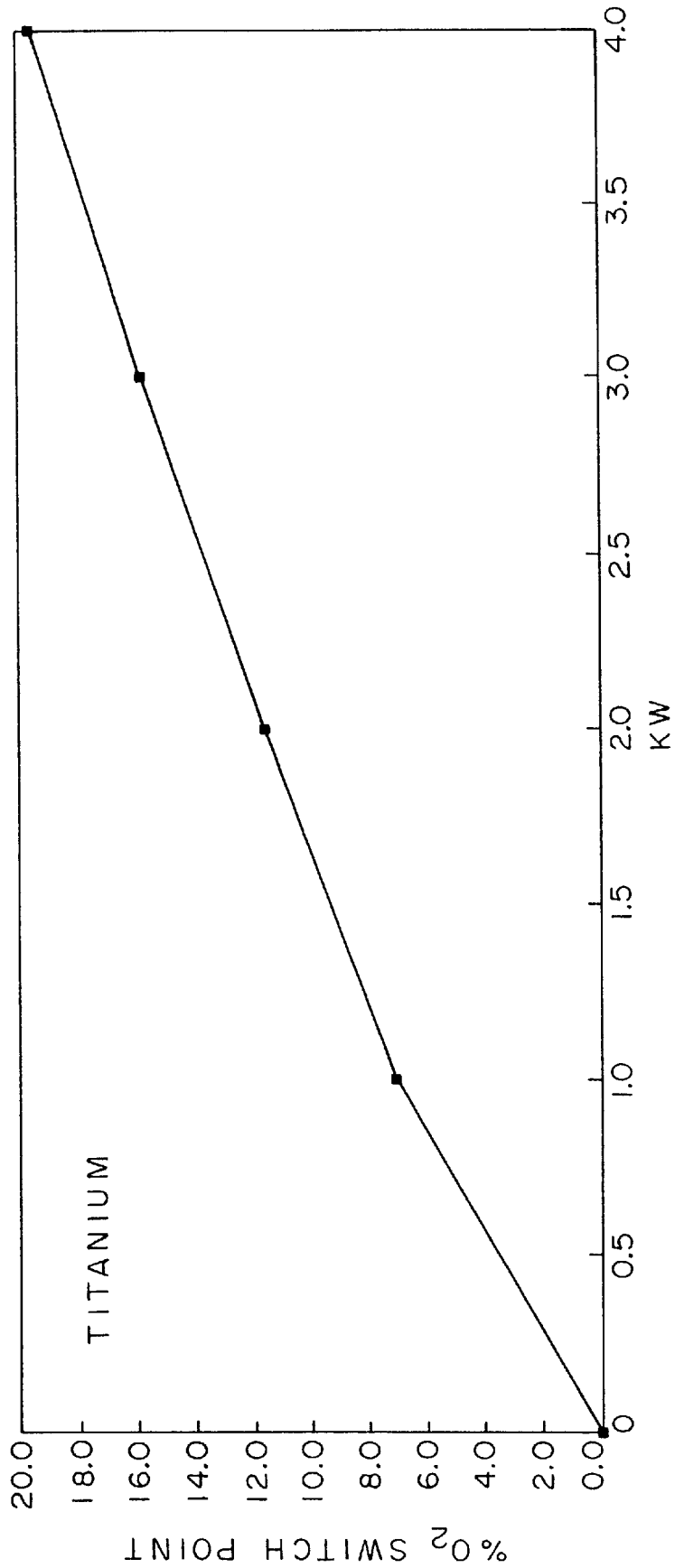
FIG. 1 illustrates the maximum percentage of oxygen in inert gas which allows sputtering of titanium in the metallic mode using an AIRCO ILS-1600 laboratory scale coater as a function of power level in kilowatts (kw).
Figure 2:
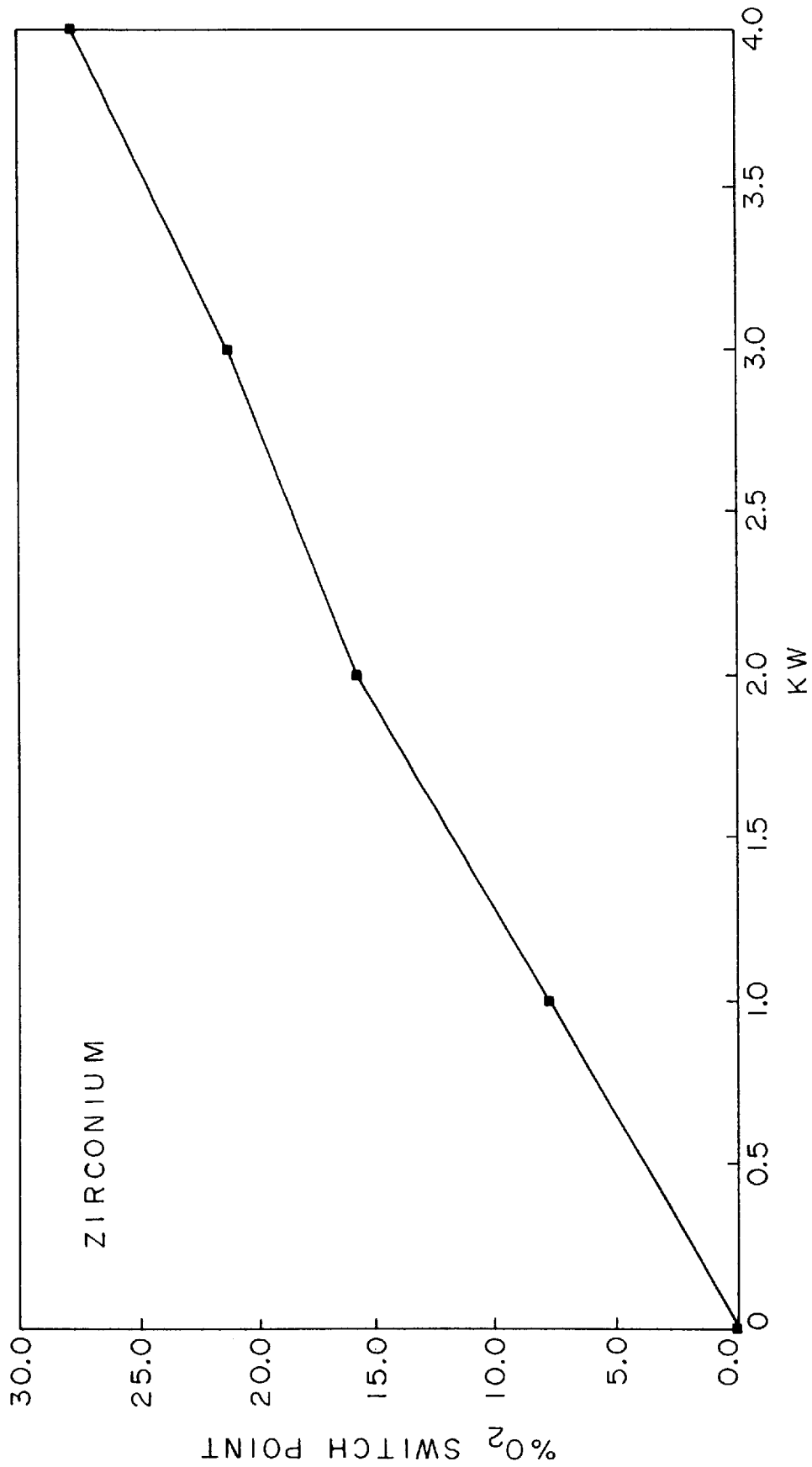
FIG. 2 illustrates the maximum percentage of oxygen in inert gas which allows sputtering of zirconium in the metallic mode using an AIRCO ILS-1600 laboratory scale coater as a function of power level in kw.

FIGS. 1 and 2 illustrate the maximum oxygen concentration in argon at various levels of power for titanium and zirconium targets respectively operated in an AIRCO ILS-1600 laboratory scale coater. At higher oxygen concentrations, the sputtering mode will switch from metallic to oxide, resulting in the slow deposition of amorphous metal oxide. Therefore, the oxygen concentration is kept sufficiently low to avoid depositing metal oxide. However, it has been discovered that the higher the oxygen concentration, below the switching point, the harder the amorphous metal deposited in the metal sputtering mode.

Figure 3:
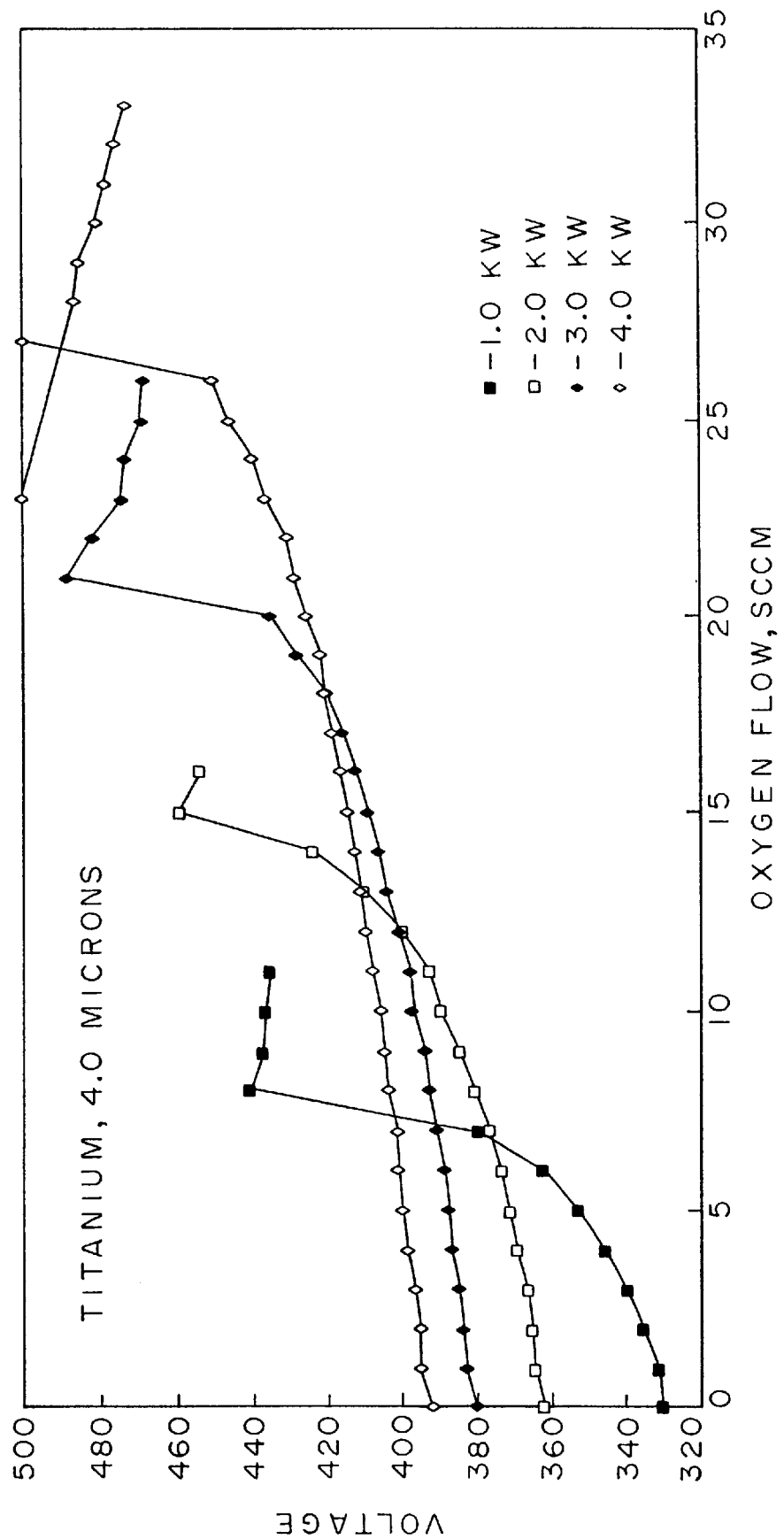
FIG. 3 illustrates the voltage as a function of percent oxygen in inert gas for the sputtering of titanium at power levels of 1, 2, 3 and 4 kilowatts using an AIRCO ILS-1600 laboratory scale coater. The peak on each curve is the switching point where the amount of oxygen causes the sputtering mode to change from the metal mode to the oxide mode.

FIG. 3 illustrates the voltage as a function of oxygen concentration for titanium films deposited at power levels of from 1 to 4 kilowatts in an AIRCO ILS-1600 laboratory scale coater. The voltage peak for each curve illustrates the switching point between metallic and oxide sputtering modes, and indicates the maximum oxygen concentration for the specified power level using this coating apparatus. It is preferred to operate near the peak, i.e. at a relatively higher concentration of oxygen, for maximum metal hardness, but without switching from the metallic sputtering mode to the oxide sputtering mode.

The amorphous metal film sputtered in an oxygen-containing but substantially nonreactive atmosphere is only slightly higher in transmission than a metal film sputtered in pure argon; and the sputtering rate is approximately the same. However, the amorphous metal coating sputtered in an oxygen-containing but substantially nonreactive atmosphere is significantly harder and less dense than a crystalline metal film sputtered in pure argon.

The relative hardness of such metal films is determined by abrasion of the film followed by visual examination and rating on the basis of film damage. A method of judging the hardness of metal films, comprises repeated strokes of an abrasive pad (Scotch-Brite® 98 Light Duty Cleaning Pad from 3M) followed by visual examination on a light board and rating the film damage on a scale of 1 to 9, with 1 being insignificant damage and 9 being substantial removal of the metal film.

The density of amorphous titanium metal film sputtered in an essentially nonreactive atmosphere comprising inert gas and 10 percent oxygen is 4.0 grams per cubic centimeter ($g/cm^3$), compared with a density of 4.5 $g/cm^3$ for a titanium metal film sputtered in pure argon. The lower density of the amorphous titanium metal film enhances its rate of oxidation, so that the amorphous titanium metal film may be thoroughly oxidized at lower temperatures and/or in shorter times than required for oxidation of crystalline titanium metal film.

The hard, dense, amorphous metal coating of the present invention, preferably in a thickness range of about 100 to 1500 Angstroms, more preferably about 200 to 100 Angstroms for titanium, is sufficiently durable to withstand handling, shipping and processing, such as heat strengthening, tempering and bending. It is preferred to further process the amorphous metal film of the present invention by thermally oxidizing the metal to metal oxide. The hard amorphous metal film of the present invention may be thermally oxidized to metal oxide by heating to produce a haze-free, dense, substantially crystalline metal oxide coating which is sufficiently chemically and physically durable to be coated on the exposed surface of a glass substrate. The amorphous metal film is preferably heated to a temperature of at least 400° C., preferably 500 to 700° C., in air in order to effect complete oxidation in a reasonable time, e.g. a few minutes. The method of the present invention of heating an amorphous sputtered metal film to produce a crystalline metal oxide film is a more efficient method to produce thick metal oxide films than reactively sputtering such films. Moreover, the crystalline thermally oxidized metal oxide films are more chemically durable than the substantially amorphous reactively sputtered metal oxide films. Such crystalline thermally oxidized metal oxide films may be produced over a wide range of thicknesses having a wide range of desirable reflected colors produced by interference effects.

The density of the titanium oxide coatings is determined using the measured thickness of the coating and the weight percent titanium in fully oxidized titanium oxide. The thickness was measured using a Tencor P-1 Long Scan Profiler; the weight percent titanium was measured using x-ray fluorescence. The density of the crystalline thermally oxidized titanium coating is greater than the density of amorphous reactively sputtered titanium dioxide coating; the crystalline thermally oxidized titanium oxide coating has a density of 4.0 grams per cubic centimeter ($g/cm^3$) while the amorphous sputtered titanium oxide has a density of 3.4 $g/cm^3$. The density of crystalline thermally oxidized titanium oxide coatings approaches the bulk density of 4.26 $g/cm^3$ for the rutile phase of $TiO_2$.

The refractive index at 600 nanometers of an amorphous reactively sputtered titanium oxide film is 2.3, whereas the refractive index at 600 nanometers of a crystalline titanium oxide film thermally oxidized from an amorphous titanium metal film sputtered in an essentially nonreactive atmosphere comprising argon and 10 percent oxygen is 2.5, which is nearly the refractive index of the rutile phase of bulk crystalline $TiO_2$.

In a preferred embodiment of the present invention, coatings are produced on a large-scale magnetron sputtering device capable of coating glass up to 100×144 inches (2.54×3.66 meters). Using a commercial production scale coater, the acceptable amount of reactive gas may be considerably higher without switching from the metal mode compared with a small-scale coater, particularly if multiple cathodes are sputtered simultaneously within a chamber at higher power density.

In the following examples, the coatings are deposited on a smaller scale, using planar magnetron cathodes having 5×17 inch (12.7×43.2 centimeters) targets. Base pressure is in the $10^{-6}$ Torr range. The coatings are made by first admitting the sputtering gas to a pressure of 4 microns and then setting the cathode power. In each example, glass substrates pass under the target on a conveyor roll at a speed of 120 inches (3.05 meters) per minute. The transmittance is monitored every other pass during the sputtering process at a wavelength of 550 nanometers using a Dyn-Optics 580D optical monitor. After the coating is deposited, the transmittance and reflectance from both the glass and coated surfaces are measured in the wavelength range from 380 to 720 nanometers using Pacific Scientific Spectrogard Color System spectrophotometer.

In a most preferred embodiment of the present invention, the amorphous metal film sputtered in an essentially nonreactive atmosphere comprising sufficient reactive gas to effect the deposition of a harder, less dense, amorphous, rather than crystalline, metal film, but insufficient to effect the transition of the sputtering process from the metallic to the oxide mode, is overcoated with a thin layer of reactively sputtered amorphous metal oxide. This layer of reactively sputtered amorphous metal oxide increases the thermal stability of the amorphous metal film sputtered in an essentially nonreactive atmosphere comprising inert gas and sufficient reactive gas to effect the deposition of an amorphous metal film but insufficient to effect the transition of the sputtering mode from metallic to oxide, during thermal oxidation. The amorphous sputtered metal oxide layer preferably comprises the same metal as the underlying amorphous metal layer. The thickness of the amorphous metal oxide layer is preferably in the range of 40 to 120 Angstroms.

The thickness of the underlying amorphous metal layer is preferably in the range of 200 to 1000 Angstroms prior to thermal oxidation, for production of a wide range of chromas in the metal oxide films. The amount of reactive gas in the essentially nonreactive atmosphere may vary widely depending on the metal to be sputtered, size and geometry of targets, number and power level of cathodes, and so on. The upper limit in any case is below the point at which sputtering switches from the metallic to the oxide mode. For optimum hardness of the amorphous metal film, it is preferred to operate near this upper limit consistent with maintaining sputtering in the metal mode. A range of 2 to 30 percent oxygen, preferably 5 to 25 percent may be preferred when sputtering titanium.

The present invention will be further understood from the descriptions of specific examples which follow.

EXAMPLE 1

A clear glass substrate six millimeters thick was coated with titanium as follows. A titanium cathode target was sputtered in an atmosphere of argon containing 2.5 percent oxygen. The base pressure was $2\times10^{-6}$ Torr, operating pressure 4.0 microns. Power was set at 3.0 kilowatts (kw), voltage was 381 volts (V), current was 7.8 amps and line speed 120 inches (3.05 meters), per minute. After 1 pass, the transmittance was 19.1 percent, after three passes 2.0 percent, and zero after four passes. The resistance of the titanium film was 41.9 ohms per square. The coated surface was wiped with an abrasive pad (Scotch-Brite from 3M), and the coated substrate placed on a light board for visual examination. It was rated 7 in transmittance and 5 in reflectance.

EXAMPLE 2

A glass substrate was coated as in Example 1 except that the atmosphere was argon with 5 percent oxygen, the voltage was 385 V and the current 7.7 amps. The transmittance after one pass was 21.0 percent, after three passes 2.6 percent, and less than one percent after four passes. The resistance of the titanium film was 48 ohms per square. The coated surface was rated 5 in transmittance and 4 in reflectance after abrasion.

EXAMPLE 3

A glass substrate was coated as in Examples 1 and 2 except that the atmosphere was argon with 10 percent oxygen, the voltage was 393 V and the current 7.6 amps. The transmittance after one pass was 26.4 percent, after three passes 6.0 percent, and 2.0 percent after four passes. The resistance of the titanium film was 82 ohms per square. The coated surface was rated 2 in both transmittance and reflectance after abrasion.

EXAMPLE 4

A glass substrate was coated as in the previous examples except that the atmosphere contained 15 percent oxygen, the voltage was 432 V and the current 6.9 amps. The transmittance after one pass was 57.0 percent, after three passes 21.0 percent, and 13.6 percent after, four passes. The resistance of the titanium film was 330 ohms per square. The coated surface was rated 1 in both transmittance and reflectance after abrasion. The increasing transmittance and resistance indicate that the oxygen concentration is approaching the maximum for sputtering in the metal mode, although the film is still metallic, since the resistance is still very low in comparison with the resistance of titanium oxide, which is infinite, i.e. titanium oxide is an insulating material.

COMPARATIVE EXAMPLE A

A glass substrate was coated as in the previous examples except that the atmosphere was pure argon, the voltage was 378 V and the current 7.85 amps. The transmittance after one pass was 18.0 percent, after three passes 1.8 percent, and zero after four passes. The resistance of the titanium film was 24 ohms per square. The coated surface was rated 9 in both transmittance and reflectance after abrasion.

EXAMPLE 5

A tinted glass (SOLEX® glass from PPG Industries, Inc.) substrate 4.0 millimeters thick was coated with titanium and titanium dioxide as follows. The first layer of coating is prepared by sputtering a planar titanium cathode in an atmosphere of argon containing 10 percent oxygen. The base pressure was $7.0 \times 10^{-6}$ Torr, operating pressure 4.0 microns, power set at 3.4 kilowatts, voltage was 399 volts, current 8.42 amps and line speed 120 inches (3.05 meters) per minute. After 4 passes, the transmittance was 1.4 percent. The titanium layer thickness was 599 Angstroms. This layer deposition was followed by reactively sputtering titanium in a 50/50 argon/oxygen gas mixture. Power was set at 5.0 kilowatts, voltage was 470 volts, current 10.57 amps and the line speed 120 inches (3.05 meters) per minute. After 6 passes, the final transmittance was 2.0 percent. The coating thickness for the reactively sputtered titanium oxide layer was 76 Angstroms. The two layer coating was then heated for 4 minutes to a temperature of 650° C., producing a single homogeneous layer of titanium oxide coating with thickness of 1062 Angstroms. The optical properties of the coated article were analyzed and are shown in the Table following the Examples.

EXAMPLE 6

A clear glass substrate 6.0 millimeters thick was coated with titanium as follows. A coating was prepared by sputtering a planar titanium cathode in an atmosphere of argon containing 10 percent oxygen. The base pressure was $5.9 \times 10^{-6}$ Torr, operating pressure 4.0 microns, power set at 3.4 kilowatts, voltage was 398 volts, current 8.45 amps and line speed 120 inches (3.05 meters) per minute. After 6 passes the transmittance was zero. The coating thickness was 893 Angstroms. The coating was then heated for 6.5 minutes to a temperature of 637° C. producing an oxide coating with a thickness of 1469 Angstroms. The optical properties are shown in the Table following the Examples.

EXAMPLE 7

A clear glass substrate 6.0 millimeters thick was coated with titanium as follows. A coating was prepared by sputtering a planar titanium cathode in an atmosphere of argon containing 10 percent oxygen. The base pressure was $5.0 \times 10^{-6}$ Torr, operating pressure 4.0 microns, power set at 3.4 kilowatts, voltage was 398 volts, current 8.45 amps and line speed 120 inches (3.05 meters) per minute. After 5 passes the transmittance was 0.5 percent. The coating thickness was 742 Angstroms. The coating was then heated for 6.5 minutes to a temperature of 637° C., producing an oxide coating with a thickness of 1220 Angstroms. The optical properties are shown in the Table following the Examples.

EXAMPLE 8

A clear glass substrate 6.0 millimeters thick was coated with titanium as follows. A coating was prepared by sputtering a planar titanium cathode in an atmosphere of argon containing 10 percent oxygen. The base pressure was $3.9 \times 10^{-6}$ Torr, operating pressure 4.0 microns, power was set at 3.4 kilowatts, voltage was 398 volts, current 8.45 amps and line speed 120 inches (3.05 meters) per minute. After 4 passes the transmittance was 1.6 percent. The coating thickness was 599 Angstroms. The coating was then heated for 6.5 minutes to a temperature of 637° C., producing an oxide coating with a thickness of 986 Angstroms. The optical properties are shown in the Table following the Examples.

EXAMPLE 9

A clear glass substrate 6.0 millimeters thick was coated with titanium as follows. A coating was prepared by sputtering a planar titanium cathode in an atmosphere of argon containing 10 percent oxygen. The base pressure was $5.9 \times 10^{-6}$ Torr, operating pressure 4.0 microns, power was set at 3.4 kilowatts, voltage was 398 volts, current 8.45 amps and line speed 120 inches (3.05 meters) per minute. After 3 passes the transmittance was 3.9 percent. The coating thickness was 447 Angstroms. The coating was then heated for 6.5 minutes to a temperature of 637° C., producing an oxide coating with a thickness of 735 Angstroms. The optical properties are shown in the Table following the Examples.

EXAMPLE 10

A clear glass substrate 6.0 millimeters thick was coated with titanium as follows. A coating was prepared by sputtering a planar titanium cathode in an atmosphere of argon containing 10 percent oxygen. The base pressure was $5.2 \times 10^{-6}$ Torr, operating pressure 4.0 microns, power was set at 3.4 kilowatts, voltage was 398 volts, current 8.45 amps and line speed 120 inches (3.05 meters) per minute. After 2 passes the transmittance was 8.9 percent. The coating thickness was 301 Angstroms. The coating was then heated for 6.5 minutes to a temperature of 637° C., producing an oxide coating with thickness of 495 Angstroms. The optical properties are shown in the Table following the Examples.

EXAMPLE 11

A tinted glass (SOLEX® glass from PPG Industries, Inc.) substrate 4.0 millimeters thick was coated with titanium as follows. A coating was prepared by sputtering a planar titanium cathode in an atmosphere of argon containing 10 percent oxygen. The base pressure was $7.0 \times 10^{-6}$ Torr, operating pressure 4.0 microns, power was set at 3.4 kilowatts, voltage was 400 volts, current 8.4 amps and line speed 120 inches (3.05 meters) per minute. After 4 passes the transmittance was 1.5 percent. The coating thickness was 599 Angstroms. The coating was then heated for 4 minutes to a temperature of 650° C., producing an oxide coating with thickness of 986 Angstroms. The optical properties are shown in the Table following the Examples.

TABLE

| Ex-ample # | Transmittance* | | | Reflectance* | | | | | |
|---|---|---|---|---|---|---|---|---|---|
| | | | | Film Side | | | Glass Side | | |
| | Y | x | y | Y | x | y | Y | x | y |
| 5 | 74.46 | .3102 | .3646 | 12.25 | .3038 | .2152 | 10.34 | .3032 | .2286 |
| 6 | 65.71 | .3444 | .3373 | 30.43 | .2418 | .3182 | 28.94 | .2412 | .3209 |
| 7 | 82.90 | .3451 | .3792 | 13.23 | .2056 | .1833 | 12.82 | .2074 | .1884 |
| 8 | 79.31 | .2968 | .3374 | 17.33 | .3733 | .3072 | 16.37 | .3679 | .3105 |
| 9 | 60.37 | .2897 | .3022 | 36.54 | .3574 | .3914 | 34.31 | .3502 | .3922 |
| 10 | 56.63 | .3205 | .3374 | 40.09 | .2985 | .3205 | 37.76 | .2940 | .3224 |
| 11 | 72.15 | .2925 | .3398 | 17.51 | .3794 | .3165 | 14.73 | .3652 | .3264 |

*C.I.E. Chromaticity Coordinates (1931 2 degree observer, Illuminant D-65)

The above examples are offered to illustrate the present invention. Other metals such as zirconium, tantalum, vanadium, hafnium and niobium may be sputtered in an atmosphere which contains a reactive gas but which remains essentially nonreactive. Other reactive gases such as nitrogen may be used instead of or in addition to oxygen. The amount of reactive gas is kept sufficiently low so that the sputtering mode is essentially metallic, and the film deposited is essentially metallic. To optimize the hardness of the metal film, the amount of reactive gas in the inert gas is preferably as high as is consistent with maintaining an essentially nonreactive atmoshere, i.e. sputtering in the metallic mode. When the reactive gas is oxygen, the minimum amount is sufficient to effect deposition of amorphous metal, generally at least about 2 percent, and higher amounts, at least about 10 percent, are preferred in order to thermally oxidize at an efficient rate. Thermal oxidation of the metallic film may be performed throughout a range of temperatures sufficient to oxidize the metal without deteriorating the integrity of the film. Typically, a temperature of at least 400° C. is selected to thoroughly oxidize the metal film in a reasonable time, e.g. a few minutes. Film thicknesses may vary over a wide range to obtain desirable properties, particularly interference color effects in reflectance. The scope of the invention is defined by the following claims.

What is claimed is:

1. The method of producing a substantially amorphous metal film by cathode sputtering comprising the steps of:
   placing a substrate in an evacuated chamber having an atmosphere comprising argon and up to 30% oxygen; and
   sputtering a titanium cathode target below its switch point in the chamber wherein the atmosphere is sufficiently inert that the titanium is sputtered to deposit a titanium film and sufficiently reactive that the titanium film deposited is substantially amorphous; and
   after the practice of the sputtering step, oxidizing the titanium film.

2. The method according to claim 1, further comprising the step of depositing a metal oxide layer over the amorphous metal film prior to the practice of the oxidizing step wherein the amorphous metal film is thermally oxidized.

3. The method according to claim 1 wherein after the practice of the oxidizing step the titanium amorphous film is a titanium oxide crystalline film.

4. The method according to claim 3 wherein the titanium amorphous film is thermally oxidized.

5. The method according to claim 3 wherein the titanium oxide crystalline film has a crystalline structure having a density greater than 3.4 g/cm$^3$.

6. The method according to claim 1 wherein the titanium film deposited is a titanium metal film.

7. A method of producing a substantially amorphous metal film by cathode sputtering comprising the steps of:
   placing a substrate in an evacuated chamber having an atmosphere comprising argon and up to 30% oxygen;
   sputtering a titanium metal cathode target in the chamber wherein the sputtering step is practiced by energizing the titanium metal cathode target and regulating the atmosphere to operate below the switch point of the target to have a predominately inert gas and sufficient reactive gas to deposit a substantially amorphous titanium metal film, and
   after the practice of the sputtering step, oxidizing the titanium film.

8. The method according to claim 7 wherein after the practice of the oxidizing step the titanium amorphous film is a titanium oxide crystalline film.

9. The method according to claim 8 wherein the titanium amorphous film is thermally oxidized.

10. The method according to claim 7, further comprising the step of depositing a metal oxide layer over the amorphous titanium metal film prior to the practice of the oxidizing step wherein the amorphous titanium metal film is thermally oxidized.

11. The method according to claim 7 wherein after the practice of the oxidizing step the amorphous titanium metal film is a crystalline titanium oxide film.

12. The method according to claim 11 wherein the amorphous titanium metal film is thermally oxidized.

13. The method according to claim 11 wherein the crystallized titanium oxide film has a crystalline structure having a density greater than 3.4 g/cm$^3$.

14. A method of sputter coating a substantially amorphous metal film on a substrate, comprising the steps of:
   positioning a metal cathode target and a substrate to be coated in a chamber, the metal of the metal cathode target having a reactive gas switch point and the metal cathode target when operated in an inert gas below the switch point deposits a metal film having a crystalline structure defined as a crystalline metal film, and when operated above the switch point deposits a reacted metal film having an amorphous structure defined as an amorphous reacted metal film;
   moving into the chamber a ratio of inert gas and reactive gas to provide in the chamber an atmosphere, and
   energizing the metal cathode target and regulating the atmosphere to operate below the switch point of the metal cathode target to have a predominately inert gas and sufficient reactive gas to deposit a metal film on the substrate having a substantially amorphous structure defined as an amorphous metal film.

15. The method according to claim 14, wherein the metal of the metal cathode target is selected from the group consisting of titanium, zirconium, tantalum, hafnium, niobium, vanadium and mixtures thereof.

16. The method according to claim 15, wherein the reactive gas is selected from the group consisting of oxygen, nitrogen and mixtures thereof and the inert gas is argon.

17. A method according to claim 16, wherein the atmosphere comprises argon and up to 30 percent oxygen.

18. The method according to claim 14, wherein the metal cathode target is a titanium cathode target, the reactive gas is oxygen and the switch point of the titanium cathode target is less than about 20 percent oxygen and the power is equal to or less than about 4 kilowatts.

19. The method according to claim 14, wherein the metal cathode target is a zirconium cathode target, the reactive gas is oxygen and the switch point of the zirconium cathode target is less than about 30 percent oxygen and the power is equal to or less than about 4 kilowatts.

20. The method according to claim 14 wherein the amorphous metal film is an amorphous titanium metal film.

21. The method according to claim 20 further including the step of oxidizing the amorphous titanium metal film.

22. The method according to claim 21 wherein the titanium metal film is thermally oxidized.

23. The method according to claim 22 wherein the titanium amorphous metal film after oxidizing is a titanium crystalline metal oxide film.

24. The method according to claim 14, wherein the atmosphere comprises 5 to 15 percent oxygen in argon, the amorphous metal film is an amorphous titanium film, and further comprising the steps of depositing a titanium oxide film onto the amorphous titanium film and heating the amorphous titanium film in air at a temperature of at least 400° C. to oxidize the amorphous titanium film to provide a crystalline titanium oxide film.

25. The method according to claim 14, further comprising the step of oxidizing the amorphous metal film.

26. The method according to claim 25, wherein the amorphous metal film is an amorphous titanium film and further comprising the step of depositing a metal oxide film on the amorphous titanium film prior to the step of oxidizing the amorphous titanium film.

27. The method according to claim 26, wherein said step of depositing a metal oxide film on the amorphous titanium film comprises depositing a titanium oxide film, and said step of oxidizing the amorphous titanium film comprises thermally oxidizing the amorphous titanium film.

28. The method according to claim 14, wherein:
the crystalline metal film has a predetermined property value, the amorphous reacted metal film has a predetermined property value different than the predetermined property value of the crystalline metal film;
the predetermined property value of the crystalline metal film defines a first limit and the predetermined property value of the amorphous reacted metal film defines a second limit wherein the first limit and second limit define a predetermined value range, and
the crystalline metal film has a predetermined property value different than the predetermined property value of at least one of the crystalline metal films and the amorphous metal reacted film.

29. The method according to claim 28, wherein the metal of the metal cathode target is selected from the group consisting of titanium and zirconium.

30. A method according to claim 29, wherein the metal is titanium.

31. The method according to claim 28, wherein the amorphous metal film is an amorphous titanium film and further comprising the step of oxidizing the amorphous titanium film.

32. The method according to claim 28, wherein the reactive gas is selected from the group consisting of oxygen, nitrogen and mixtures thereof.

33. The method according to claim 32, wherein the predetermined property value of the amorphous metal film is different than the predetermined property value of the crystalline metal film and of the amorphous reacted metal film and within the predetermined value range.

34. The method according to claim 33, wherein the predetermined property is hardness and the amorphous metal film is harder than crystalline metal film and softer than the amorphous reacted metal films.

35. The method according to claim 34, wherein the inert gas is argon.

36. The method according to claim 33, wherein the reactive gas is oxygen and the inert gas is argon.

37. The method according to claim 36, wherein the metal of the metal cathode target is selected from the group consisting of titanium and zirconium.

38. The method according to claim 37, wherein the metal of the metal cathode target is titanium, and the atmosphere comprises from 2 to 30 percent oxygen in argon.

39. A method according to claim 33, wherein the reactive gas is oxygen.

40. The method according to claim 39, wherein the predetermined property is hardness and the amorphous metal film is harder than the crystalline metal film and softer than the amorphous reacted metal film.

41. The method according to claim 39, wherein the predetermined property is visible light transmittance and the crystalline metal film has a percent transmission lower than the percent transmission of the amorphous reacted metal film and the amorphous metal film has a percent transmission greater than the percent transmission of the crystalline metal film and less than the percent transmission of the amorphous reacted metal film wherein the thickness of the crystalline metal film, amorphous reacted metal film and amorphous metal film being substantially equal.

42. The method according to claim 41, wherein the difference between the percent transmission of the crystalline metal film and the amorphous metal film is less than the difference between the percent transmission of the amorphous metal film and the amorphous reacted metal film.

43. The method according to claim 39, wherein the predetermined property is electrical conductivity and the crystalline metal film has an electrical conductivity greater than the electrical conductivity of the amorphous reacted metal film and the amorphous metal film has an electrical conductivity greater than the electrical conductivity of the amorphous reacted metal film and less than the electrical conductivity of the crystalline metal film wherein the thickness of the crystalline metal film, amorphous reacted metal film and amorphous metal film being substantially equal.

44. The method according to claim 39, wherein the predetermined property is percent reflectance with the crystalline metal film having a percent reflectance greater than the percent reflectance of the amorphous reacted metal film and the amorphous metal film having a percent reflectance higher than the percent reflectance of the amorphous reacted metal film and lower than the crystalline metal film wherein the thickness of the crystalline metal film, amorphous reacted metal film and the amorphous metal film are substantially equal.

45. The method according to claim 39, wherein the predetermined property is density and the amorphous metal film has a density less than the density of crystalline metal film and greater than the density of amorphous reacted metal film.

\* \* \* \* \*